US010658982B1

(12) United States Patent
Drees et al.

(10) Patent No.: US 10,658,982 B1
(45) Date of Patent: May 19, 2020

(54) DYNAMICALLY LINEARIZING MULTI-CARRIER POWER AMPLIFIERS

(71) Applicant: MOTOROLA SOLUTIONS, INC., Chicago, IL (US)

(72) Inventors: Dennis M. Drees, Deer Park, IL (US); Mitchell R. Blozinski, Lake In The Hills, IL (US); Rodney W. Hagen, Lake In The Hills, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/231,306

(22) Filed: Dec. 21, 2018

(51) Int. Cl.
*H03F 1/14* (2006.01)
*H03F 1/02* (2006.01)
(Continued)

(52) U.S. Cl.
CPC ............ *H03F 1/0277* (2013.01); *H03F 3/24* (2013.01); *H04B 1/04* (2013.01); *H03F 1/3241* (2013.01);
(Continued)

(58) Field of Classification Search
CPC ........ H03F 1/0277; H03F 3/24; H03F 1/3247; H03F 1/3241; H03F 1/3229; H03F 3/72;
(Continued)

(56) References Cited

U.S. PATENT DOCUMENTS 5,949,283 A   9/1999  Proctor et al.
8,301,090 B2* 10/2012 Brown ...................... H03F 1/26
                                                          330/149
(Continued)

FOREIGN PATENT DOCUMENTS

GB    2293509 A    3/1996
WO    03/088511 A1  10/2003

OTHER PUBLICATIONS

Piazza et al., "Multicarrier LUT-based Data Predistortion for Nonlinear Satellite Channels," IEEE ICC (2014) Selected Areas in Communications Symposium, pp. 319-324.
(Continued)

*Primary Examiner* — Khanh V Nguyen
(74) *Attorney, Agent, or Firm* — Michael Best & Friedrich LLP (57) ABSTRACT

Apparatus and method for dynamically linearizing multi-carrier power amplifiers. In one example, the method includes storing a correction set including a plurality of correction solutions and loading the correction set into an RF power amplifier linearizer. The method includes determining a first carrier configuration of an RF transmitter during a first timeslot of operation of the RF transmitter and sending a first correction solution index to the RF power amplifier linearizer. The first correction solution index corresponds to a first correction solution of the plurality of correction solutions. The method also includes determining that a carrier configuration change is initiated to operate the RF transmitter with a second carrier configuration during a second timeslot of operation of the RF transmitter and sending a second correction solution index to the RF power amplifier linearizer. The second correction solution index corresponds to a second correction solution of the plurality of correction solutions.

17 Claims, 5 Drawing Sheets

(51) Int. Cl.
  *H04B 1/04*    (2006.01)
  *H03F 3/24*    (2006.01)
  *H03F 1/32*    (2006.01)
(52) U.S. Cl.
  CPC .... *H03F 1/3247* (2013.01); *H04B 2001/0408* (2013.01)
(58) Field of Classification Search
  CPC . H04B 1/04; H04B 2001/0408; H03G 1/0088
  USPC .................................................. 330/51, 149
  See application file for complete search history.

(56) References Cited

U.S. PATENT DOCUMENTS

| | | | |
|---|---|---|---|
| 9,136,887 B2* | 9/2015 | Zhao .................... | H04B 1/0475 |
| 10,097,141 B1 | 10/2018 | Almog et al. | |
| 2016/0254788 A1* | 9/2016 | Kularatna ............. | H03F 1/3247 330/278 |
| 2018/0115332 A1* | 4/2018 | Kishibe ................ | H03F 1/3247 |

OTHER PUBLICATIONS

Ming et al., "Multi-Carrier TD-SCDMA Power Amplifier Linearization with a Memory Polynomial Predistorter", Wireless Communications, Networking and Mobile Computing (WICOM), 2011 7th International Conference, Sep. 23, 2011 pp. 1-4 (4 pages).
International Search Report & Written Opinion dated Feb. 26, 2020 for related International Application No. PCT/US2019/064975 (18 pages).

\* cited by examiner

DYNAMICALLY LINEARIZING MULTI-CARRIER POWER AMPLIFIERS

BACKGROUND OF THE INVENTION

Radio-frequency (RF) signals are transmitted by modulating a carrier wave to encode information on to the carrier wave. Radio-frequency (RF) transmitters typically use a single carrier wave having specific carrier attributes, for example, bandwidth, frequency, power level, and the like. RF signals are passed through a power amplifier to amplify the signals before transmission. Power amplifiers however may introduce distortion into the amplified signal that may interfere with other channels on the network.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted above, power amplifiers are used in RF communication systems. To reduce the distortion introduced by the power amplifier, a predistortion loop including a linearizer is used to predistort the input signal to the power amplifier. The linearizer provides a correction, sometimes referred to as a correction solution, coupled on to the input signal based on the carrier attributes and a feedback signal received from the output of the power amplifier. The linearizer adapts the correction solutions to meet, for example, emission standards set for the power amplifier. Generation of a predistorted correction signal results in a delay when an input signal is first received by the linearizer.

In Land Mobile Radio (LMR) systems, the carrier attributes of the RF signals are dynamic. For example, the bandwidth, frequency, power level, modulation, and the like are changed according to a predetermined schedule. In some situations, the carrier attributes may change before the linearizer can achieve an acceptable amount of correction in the RF signal.

Accordingly, there is a need for dynamically linearizing multi-carrier power amplifiers so that the correction solution can be applied in time to achieve the desired correction in the RF signal.

Broadband multi-carrier power amplifier systems, such as those used in cellular technologies, typically include one or two broadband signals that are sufficiently spaced to reduce inter signal interference. In contrast, LMR systems operate in a narrowband system with multiple inputs and small spacing between the inputs. For example, LMR systems may operate within bandwidths up to 20 Mega Hertz (MHz) with carrier spacings of about 100 kilo Hertz between input signals. Appropriate RF correction is therefore more important in LMR systems due to the close carrier spacings as compared to cellular systems. However, the techniques described below may be applied to other radio frequency signaling systems.

One embodiment provides a host controller for a radio frequency (RF) power amplifier linearizer of a radio frequency (RF) transmitter. The host controller includes a memory storing a correction set including a plurality of correction solutions. Each one of the plurality of correction solutions corresponds to one of a plurality of carrier configurations. The host controller also includes an electronic processor coupled to the memory. The electronic processor is configured to load the correction set into the RF power amplifier linearizer and determine a first carrier configuration of the RF transmitter during a first timeslot of operation of the RF transmitter. The electronic processor is also configured to send a first correction solution index to the RF power amplifier linearizer. The first correction solution index corresponds to a first correction solution of the plurality of correction solutions. The electronic processor is further configured to determine that a carrier configuration change is initiated to operate the RF transmitter with a second carrier configuration during a second timeslot of operation of the RF transmitter. The second timeslot is subsequent to the first timeslot. The electronic processor is also configured to send a second correction solution index to the RF power amplifier linearizer. The second correction solution index corresponds to a second correction solution of the plurality of correction solutions.

Another embodiment provides a method for dynamically linearizing multi-carrier power amplifiers. The multi-carrier power amplifiers are provided in a radio frequency (RF) transmitter. The method includes storing, using a memory of a host controller, a correction set including a plurality of correction solutions. Each one of the plurality of correction solutions corresponds to one of a plurality of carrier configurations. The method also includes loading, using an electronic processor of the host controller, the correction set into the RF power amplifier linearizer and determining, using the electronic processor, a first carrier configuration of the RF transmitter during a first timeslot of operation of the RF transmitter. The method further includes sending, using the electronic processor, a first correction solution index to the RF power amplifier linearizer. The first correction solution index corresponds to a first correction solution of the plurality of correction solutions. The method also includes determining, using the electronic processor, that a carrier configuration change is initiated to operate the RF transmitter with a second carrier configuration during a second timeslot of operation of the RF transmitter. The second timeslot is subsequent to the first timeslot. The method further includes sending, using the electronic processor, a second correction solution index to the RF power amplifier linearizer. The second correction solution index corresponds to a second correction solution of the plurality of correction solutions.

Another embodiment provides a host controller for a radio frequency (RF) power amplifier linearizer of a radio frequency (RF) transmitter. The host controller includes a memory a correction set including a plurality of correction solutions. Each one of the plurality of correction solutions corresponds to one of a plurality of carrier configurations and is associated with a weight factor. The host controller also includes an electronic processor coupled to the memory. The electronic processor is configured to load the correction set into the RF power amplifier linearizer and determine a first carrier configuration of the RF transmitter during a first timeslot of operation of the RF transmitter. The electronic processor is also configured to send a correction solution index to the RF power amplifier linearizer. The correction solution index corresponds to a first correction solution of the plurality of correction solutions. The electronic processor is further configured to enable adaption of the RF power amplifier linearizer. The RF power amplifier linearizer adapts the first correction solution in response to enabling adaption to create a second correction solution. The electronic processor is also configured to determine that a carrier configuration change is initiated to operate the RF transmitter with a second carrier configuration during a second timeslot of operation of the RF transmitter. The second timeslot is subsequent to the first timeslot. The electronic processor is further configured to suspend adaption of the RF power amplifier linearizer in response to determining that the carrier configuration change is initiated and read a linearizer weight factor from the RF power amplifier linearizer associated with the second correction solution. The electronic processor is also configured to compare the linearizer weight factor with a weight factor associated with the first correction solution and replace the first correction solution with the second correction solution in response to determining that the linearizer weight factor is improved over the weight factor associated with the first correction solution.

Figure 1:
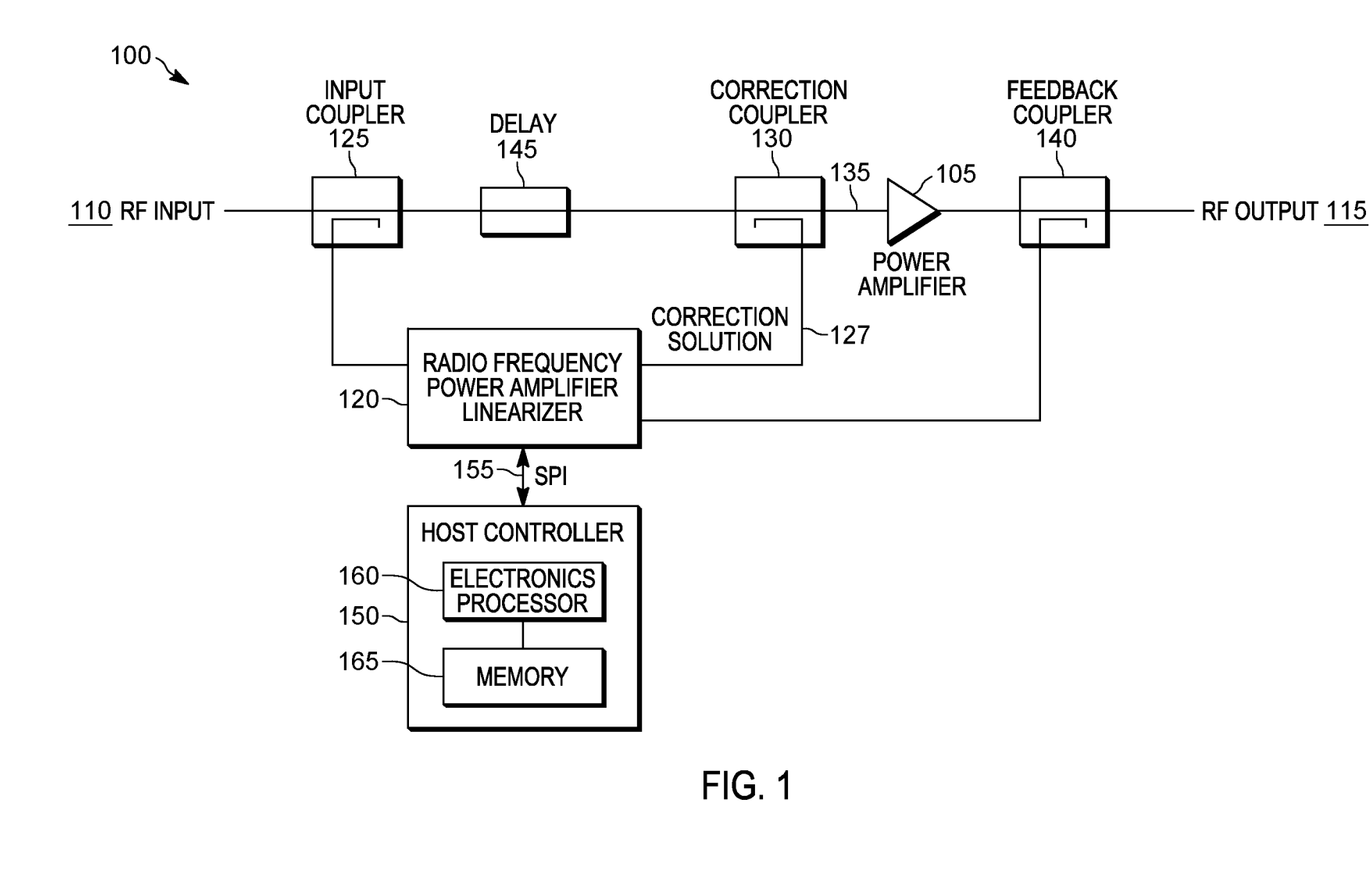
FIG. 1 is a simplified block diagram of a radio frequency (RF) transmitter in accordance with some embodiments.

FIG. 1 is a simplified block diagram of a RF transmitter 100 in accordance with some embodiments. The RF transmitter 100 is, for example, a land mobile radio base station transmitter deployed by a public safety organization (for example, a police department, a fire department, and the like). In some embodiments, the RF transmitter 100 is a multi-carrier transmitter including a multi-carrier power amplifier system. The RF transmitter 100 may include more or fewer components than those illustrated in FIG. 1 and may perform more or fewer functions than those described herein. The RF transmitter 100 includes a multi-carrier power amplifier 105 configured to amplify a radio frequency (RF) input signal 110 and output a radio frequency (RF) output signal 115, for example, to an antenna. A radio frequency (RF) power amplifier linearizer 120 predistorts the RF input signal 110 before the RF input signal 110 is provided to the multi-carrier power amplifier 105. The RF power amplifier linearizer 120 is, for example, an analog predistorter or a digital predistorter.

The RF power amplifier linearizer 120 receives the RF input signal 110 through an input coupler 125 and provides a correction signal 127 to the RF input signal 110 through a correction coupler 130 to generate a correction input signal 135. The correction signal 127 is generated by creating a predistorted version of the RF input signal 110 by applying a non-linear transformation with a correction solution to generate inverse power amplifier intermodulation distortion. The correction solution includes, for example, a set of coefficients for the non-linear transformation and other parameters of the RF power amplifier linearizer 120. The correction input signal 135 is then amplified by the multi-carrier power amplifier 105 to provide the RF output signal 115. The intermodulation distortion generated by the power amplifier 105 is thus canceled by the inverse intermodulation distortion introduced in the RF input signal 110. The RF power amplifier linearizer 120 also receives the RF output signal 115 through a feedback coupler 140. The RF power amplifier linearizer 120 determines the correction solution based on the carrier attributes of the RF input signal 110 and the feedback signal received from the feedback coupler 140. A delay 145 is introduced between the input coupler 125 and the correction coupler 130. The delay 145 delays the RF input signal 110 between the input coupler 125 and the correction coupler 130 such that the correction signal 127 is applied at the desired instance on the RF input signal 110. The delay 145 is therefore configured to match a delay caused by the RF power amplifier linearizer 120.

A host controller 150 communicates with the RF power amplifier linearizer 120 over an interface 155. The interface 155 is, for example, a serial peripheral interface, a inter integrated circuit interface, and the like. The host controller 150 includes an electronic processor 160 and a memory 165. In some embodiments, the electronic processor 160 is implemented as a microprocessor with separate memory, for example, the memory 165. In other embodiments, the electronic processor 160 is implemented as a microcontroller or digital signal processor (with memory 165 on the same chip). In other embodiments, the electronic processor 160 is implemented using multiple processors. In addition, the electronic processor 160 may be implemented partially or entirely as, for example, a field-programmable gate array (FPGA), an application specific integrated circuit (ASIC), and the like and the memory 165 may not be needed or be modified accordingly. In the example illustrated, the memory 165 includes non-transitory, computer-readable memory that stores instructions that are received and executed by the electronic processor 160 to carry out the functionality of the host controller 150 described herein. The memory 165 may include, for example, a program storage area and a data storage area. The program storage area and the data storage area may include combinations of different types of memory, for example, read-only memory and random-access memory.

In static carrier systems, where the carrier attributes remain static, the RF power amplifier linearizer 120 adapts the correction solution to deliver the desired amount of correction for a given RF input signal 110. However, in a dynamic carrier system, such as an LMR system, the carrier attributes are dynamic. When the carrier attributes are changed, a previous correction solution may no longer be applicable for the present RF input signal 110. Additionally, the carrier attributes may be changed again before the RF power amplifier linearizer 120 can adapt to apply an updated correction solution for a given RF input signal 110.

The memory 165 stores a correction set including a plurality of correction solutions. As discussed in further detail below, the host controller 150 loads the correction set into the RF power amplifier linearizer 120 and selects one of the plurality of the correction solutions based on determining a change in the carrier configuration.

Figure 2:
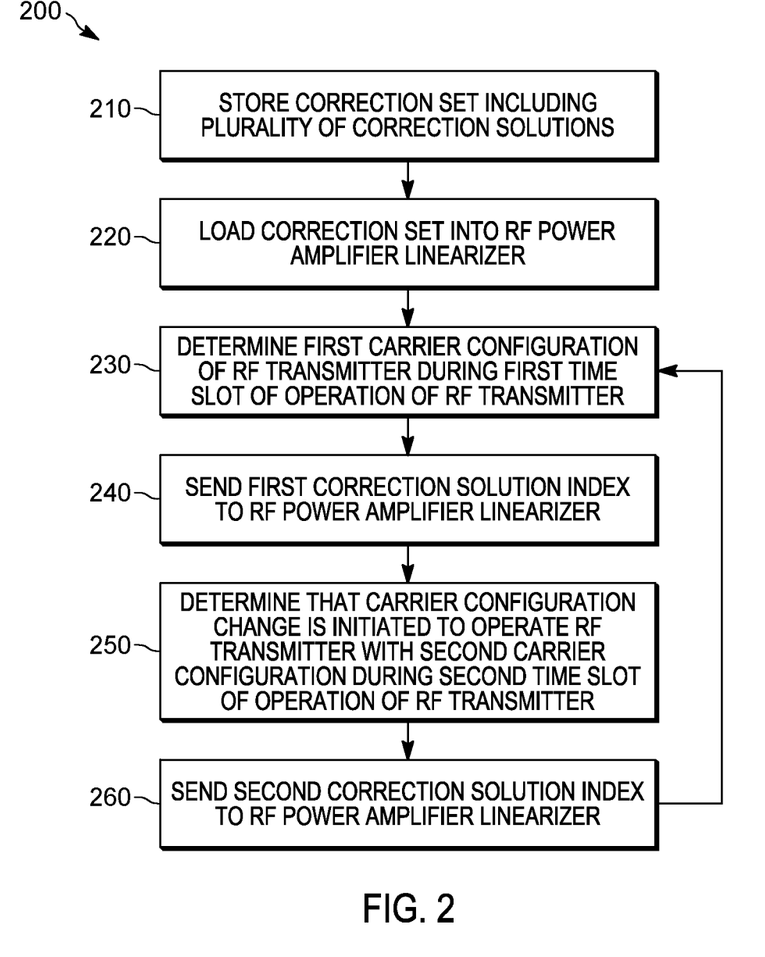
FIG. 2 is a flowchart of a method for dynamically linearizing multi-carrier power amplifiers in accordance with some embodiments.

FIG. 2 is a flowchart of an example method 200 for dynamically linearizing the multi-carrier power amplifiers 105. In the example illustrated, the method 200 includes storing, using the memory 165 of a host controller 150, the correction set including a plurality of correction solutions (at block 210). Each one of the plurality of correction solutions corresponds to one of a plurality of carrier configurations. In one example, the correction set includes twenty-eight correction solutions corresponding to different carrier configurations. The memory 165 also stores a mapping between the plurality of correction solutions and the plurality of carrier configurations. The mapping may be stored in the form of a look-up table with each variation of the carrier count, the power, and the bandwidth corresponding to one of the plurality of correction sets. The correction set is associated with a factory calibration temperature, for example, 25° Celsius (C). In some embodiments, the correction set may be associated with more than one temperature or temperature range. Each one of the plurality of correction solutions is also associated with a weight factor. The memory 165 stores the weight factors and the temperatures associated with the plurality of the correction solutions and the correction set respectively. In LMR systems, the carrier configuration is dynamic and changed according to the requirements and specifications of the organization deploying the RF transmitter 100. Predetermined correction solutions are determined for the several carrier configurations that the RF transmitter 100 can operate at based on standard power amplifier temperature. The correction solutions for each carrier configuration are compiled into the correction set and stored in the memory 165. The carrier configuration includes, for example, number of radio frequency (RF) carriers (for example, carrier count of the RF transmitter 100), a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers (for example, carrier power of the RF transmitter 100), and carrier bandwidths of each of the RF carriers (for example, carrier bandwidth of the RF transmitter 100).

The method 200 also includes loading, using the electronic processor 160 of the host controller 150, the correction set into the RF power amplifier linearizer 120 (at block 220). The RF power amplifier linearizer 120 stores the correction set in a memory of the RF power amplifier linearizer 120. The plurality of correction solutions of the correction set may be used as the starting point by the RF power amplifier linearizer 120 to predistort the RF input signal 110. As discussed above, the correction set may correspond to the factory calibration temperature, a temperature range, and/or additional power amplifier temperatures. In some embodiments, a correction set corresponding to a different power amplifier temperature may be loaded into the RF power amplifier linearizer 120.

The method 200 also includes determining, using the electronic processor 160 of the host controller 150, a first carrier configuration of the RF transmitter 100 during a first timeslot of operation of the RF transmitter 100 (at block 230). The electronic processor 160 may include a multi-carrier scheduler module or communicate with a multi-carrier scheduler module of the RF transmitter 100 to determine the carrier configuration of the RF transmitter 100. The multi-carrier scheduler changes the carrier configuration after every predetermined period of time. For example, the multi-carrier scheduler may change the carrier configuration every 100 milliseconds or less. Accordingly, each carrier configuration is active for a timeslot of 100 milliseconds or less. In some embodiments, the carrier configuration may be changed at arbitrary time intervals. In these embodiments, the first timeslot refers to the period of time for which the first carrier configuration is active. The electronic processor 160 communicates with the multi-carrier scheduler to determine that the RF transmitter 100 is operating with the first carrier configuration for the first 100 millisecond or less timeslot.

The method 200 further includes sending, using the electronic processor 160, a first correction solution index to the RF power amplifier linearizer 120 (at block 240). The first correction solution is associated with the first carrier configuration in the mapping between the plurality of carrier configurations and the plurality of correction solutions. The correction solution index allows the electronic processor 160 to select one correction solution from the plurality of correction solutions to be applied to the RF input signal 110. The first correction solution index corresponds to a first correction solution of the plurality of correction solutions. The RF power amplifier linearizer 120 applies the first correction solution to the RF input signal 110 in response to receiving the first correction solution index. The electronic processor 160 uses the mapping to determine the correction solution (that is, the first correction solution) corresponding to the first carrier configuration. By pre-loading the correction solution into the RF power amplifier linearizer 120 desired predistortion can be achieved for the duration of the first timeslot. In contrast, if the correction solutions are not pre-loaded into the RF power amplifier linearizer 120, the RF power amplifier linearizer 120 may not achieve the desired correction before a carrier configuration is changed.

The method 200 also includes determining, using the electronic processor 160, that a carrier configuration change is initiated to operate the RF transmitter 100 with a second carrier configuration during a second timeslot of operation of the RF transmitter 100 (at block 250). The second timeslot is subsequent to the first timeslot. For example, the second timeslot is the next 100 millisecond or less timeslot after the first timeslot. In some embodiments, the second timeslot is the period of time after the first timeslot for which the second carrier configuration is active. As discussed above, the electronic processor 160 determines the carrier change based on the multi-carrier scheduler. In some embodiments, the carrier change is initiated when the host controller 150 or a separate controller of the RF transmitter 100 controls carrier wave generators and modems to change the carrier attributes of the RF transmitter 100, for example, by changing the carrier count, frequency, bandwidth, power level.

The method 200 also includes sending, using the electronic processor 160, a second correction solution index to the RF power amplifier linearizer 120 (at block 260). The second correction solution is associated with the second carrier configuration in the mapping between the plurality of carrier configurations and the plurality of correction solutions. The electronic processor 160 uses the mapping to determine the correction solution (that is, the second correction solution) corresponding to the second carrier configuration. The RF power amplifier linearizer 120 applies the second correction solution to the RF input signal 110 in response to receiving the second correction solution index. In some embodiments, the electronic processor 160 may select a correction set in advance of the starting point of a timeslot. For example, the electronic processor 160 may select the second correction solution 4 milliseconds before the start of the second timeslot to account for the execution latency of the RF power amplifier linearizer 120. In other embodiments, the electronic processor 160 may load the correction solution at the starting point of the timeslot. The method 200 repeats to determine the next carrier configuration and select the correction solution associated with the next carrier configuration in the RF power amplifier linearizer 120. In some embodiments, the method 200 does not select a new correction solution for every carrier configuration change. Rather, the method 200 may work with the previously selected correction solution.

The RF power amplifier linearizer 120 determines a weight factor for each correction solution. The weight factor indicates the amount of correction achieved in the RF output signal 115. In some embodiments, the RF power amplifier linearizer 120 determines the weight factor by calculating an intermodulation distortion in the RF output signal 115. The RF power amplifier linearizer 120 determines the intermodulation distortion (IMD) based on the feedback signal received from the feedback coupler 140. In some embodiments, the RF power amplifier linearizer 120 determines the weight factor by calculating an adjacent channel leakage ratio (ACLR). In other embodiments, the RF power amplifier linearizer 120 determines the weight factor based on adding IMD and ACLR.

In some embodiments, the RF power amplifier linearizer 120 is capable of adapting a correction solution applied to the RF input signal 110 to generate a better solution. The better solution results in an improved weight factor compared to the weight factor of the correction solution. The electronic processor 160 may continuously update the plurality correction solutions to replace the correction solutions with the better solutions as described below. The electronic processor 160 may control the RF power amplifier linearizer 120 to enable and suspend adaption based on the requirements of the RF transmitter 100.

Figure 3:
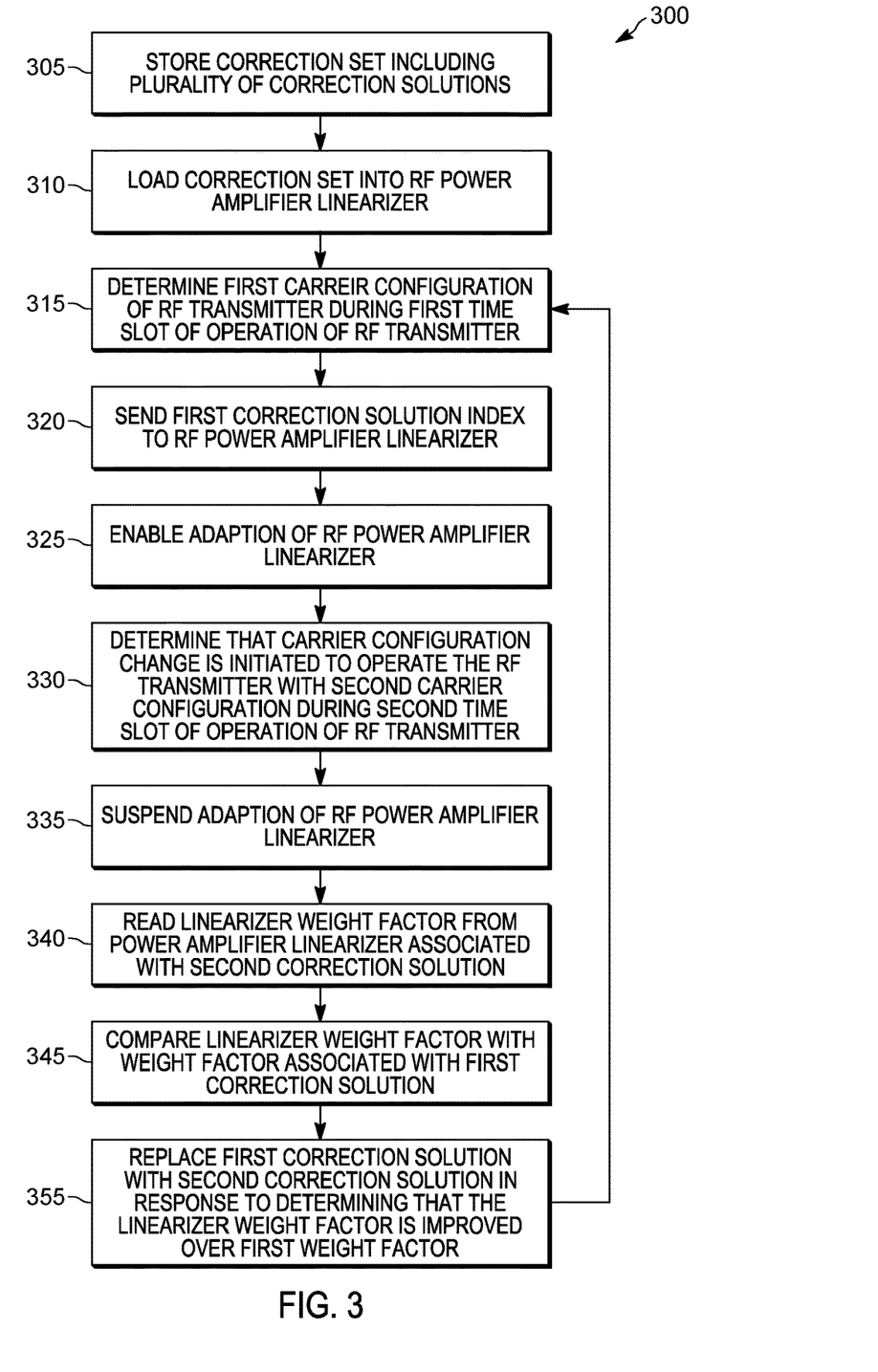
FIG. 3 is a flowchart of a method for dynamically linearizing multi-carrier power amplifiers in accordance with some embodiments.

FIG. 3 is a flowchart of a method 300 for dynamically linearizing the multi-carrier power amplifiers 105. In the example illustrated, the method 300 includes storing, using the memory 165 of a host controller 150, the correction set including a plurality of correction solutions (at block 305). Each one of the plurality of correction solutions corresponds to one of a plurality of carrier configurations. In one example, the correction set includes twenty-eight correction solutions corresponding to different carrier configurations. The memory 165 also stores a mapping between the plurality of correction solutions and the plurality of carrier configurations. The mapping may be stored in the form of a look-up table with each variation of the carrier count, the power, and the bandwidth corresponding to one of the plurality of correction sets. The correction set is associated with a factory calibration temperature, for example, 25° Celsius (C). Each one of the plurality of correction solutions is also associated with a weight factor. The memory 165 stores the weight factors and the temperatures associated with the plurality of the correction solutions and the correction set respectively. As discussed above, the weight factor is a distortion value calculated based on IMD and/or ACLR.

The method 300 also includes loading, using the electronic processor 160 of the host controller 150, the correction set into the RF power amplifier linearizer 120 (at block 310). The method 300 also includes determining, using the electronic processor 160, a first carrier configuration of the RF transmitter 100 during a first timeslot of operation of the RF transmitter 100 (at block 315).

The method 300 also includes sending, using the electronic processor 160, a first correction solution index to the RF power amplifier linearizer 120 (at block 320). The correction solution index allows the electronic processor 160 to select one correction solution from the first plurality of correction solutions to be applied to the RF input signal 110. The first correction solution index corresponds to a first correction solution of the plurality of correction solutions. The RF power amplifier linearizer 120 applies the first correction solution to the RF input signal 110 in response to receiving the first correction solution index.

The method 300 also includes enabling, using the electronic processor 160, adaption of the RF power amplifier linearizer 120 (at block 325). The RF power amplifier linearizer 120 adapts the first correction solution in response to enabling adaption to create a second correction solution (for example, a third correction solution). As discussed above, when adaption is enabled, the RF power amplifier linearizer 120 may adapt the correction solution to determine a different correction solution. The different correction solution may or may not result in an improved weight factor for the RF output signal 115.

The method 300 also includes determining, using the electronic processor 160, that a carrier configuration change is initiated to operate the RF transmitter 100 with a second carrier configuration during a second timeslot of operation of the RF transmitter 100 (at block 330). The method 300 also includes suspending, using the electronic processor 160, adaption of the RF power amplifier linearizer 120 in response to determining that the carrier configuration change is initiated (at block 335). The electronic processor 160 suspends adaption of the RF power amplifier linearizer 120 at the end of the first timeslot. The electronic processor 160 proceeds to determine whether the second correction solution adapted by the RF power amplifier linearizer 120 prior to suspending adaption is better than the first correction solution as discussed below.

Figure 5:
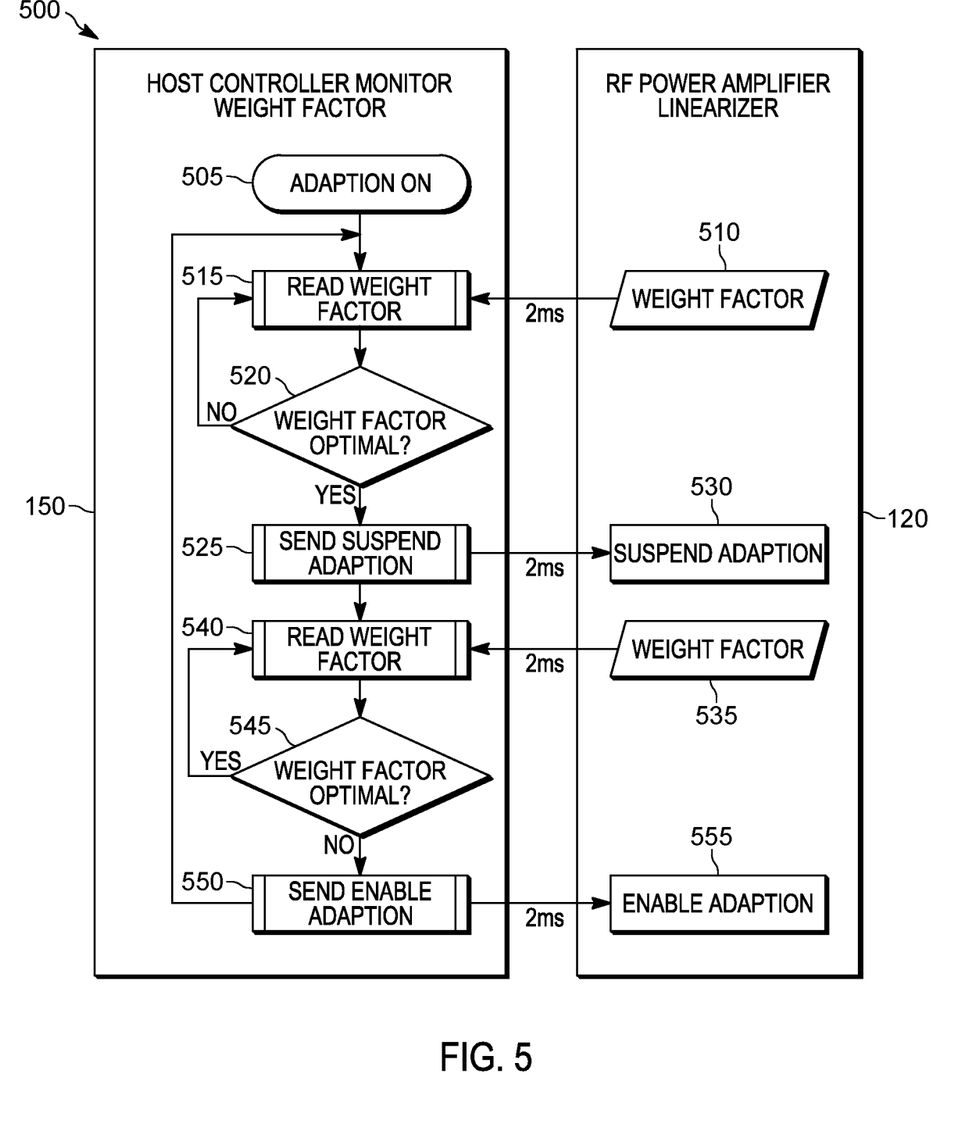
FIG. 5 is a process diagram of a method for monitoring weight factor during linearizing in accordance with some embodiments.

The method 300 also includes reading, using the electronic processor 160, a linearizer weight factor from the RF power amplifier linearizer 120 associated with the second correction solution (at block 340). The RF power amplifier linearizer 120 may continuously determine a weight factor (that is, the linearizer weight factor) of the correction solution applied by the RF power amplifier linearizer 120. In some embodiments, the electronic processor 160 constantly monitors the weight factor calculated by the RF power amplifier linearizer 120 to suspend and enable adaption during each timeslot as discussed below with respect to method 500). In other embodiments, the electronic processor 160 monitors the weight factor at the end of the timeslot after adaption is suspended.

The method 300 also includes comparing, using the electronic processor 160, the linearizer weight factor with a weight factor associated with the first correction solution (at block 345). As discussed above, the memory 165 stores weight factors associated with each one of the plurality of corrections solutions of the correction set. The electronic processor 160 retrieves the weight factor associated with the first correction solution and compares the linearizer weight factor with the weight factor associated with the first correction solution.

The electronic processor 160 replaces the first correction solution with the second correction solution in response to determining that the linearizer weight factor is improved over the weight factor associated with the first correction solution (at block 360). Based on the configuration of the RF power amplifier linearizer 120 and the host controller 150, the linearizer weight factor is improved over the first weight factor when the linearizer weight factor is lower than the first weight factor. When adaption results in a better solution than the correction solution stored in the correction set, the electronic processor 160 replaces the correction solution with the better solution. When the adaption does not result in a better solution, the electronic processor 160 keeps the previous correction solution.

In some embodiments, the method 300 also includes reading, using the electronic processor 160, a power amplifier 105 temperature value associated with the second correction solution. For example, the electronic processor 160 reads the temperature of the power amplifier 105 when the second correction solution is being applied to the RF input signal 110. The method 300 may also include generating, using the electronic processor 160, a second correction set associated with the power amplifier 105 temperature value including the plurality of correction solutions from the correction set. The electronic processor 160 replaces the first correction solution with the second correction solution (for example, a third correction solution) in the second correction set when the second correction solution results in an improved weight factor than the weight factor associated with the first correction solution. The electronic processor 160 stores the second correction set in the memory 165 in association with the power amplifier 105 temperature value. The electronic processor 160 may load the second correction set into the RF power amplifier linearizer 120 at a later time.

In one example, the electronic processor 160 loads and unloads correction sets into the RF power amplifier linearizer 120 based on the temperature of the power amplifier 105. The electronic processor 160 reads a power amplifier temperature value (for example, a second power amplifier temperature value). The electronic processor 160 retrieves a correction set corresponding to the power amplifier 105 temperature value. The electronic processor 160 loads the correction set (for example, a third correction set) associated with the power amplifier 105 temperature value into the RF power amplifier linearizer 120.

Figure 4:
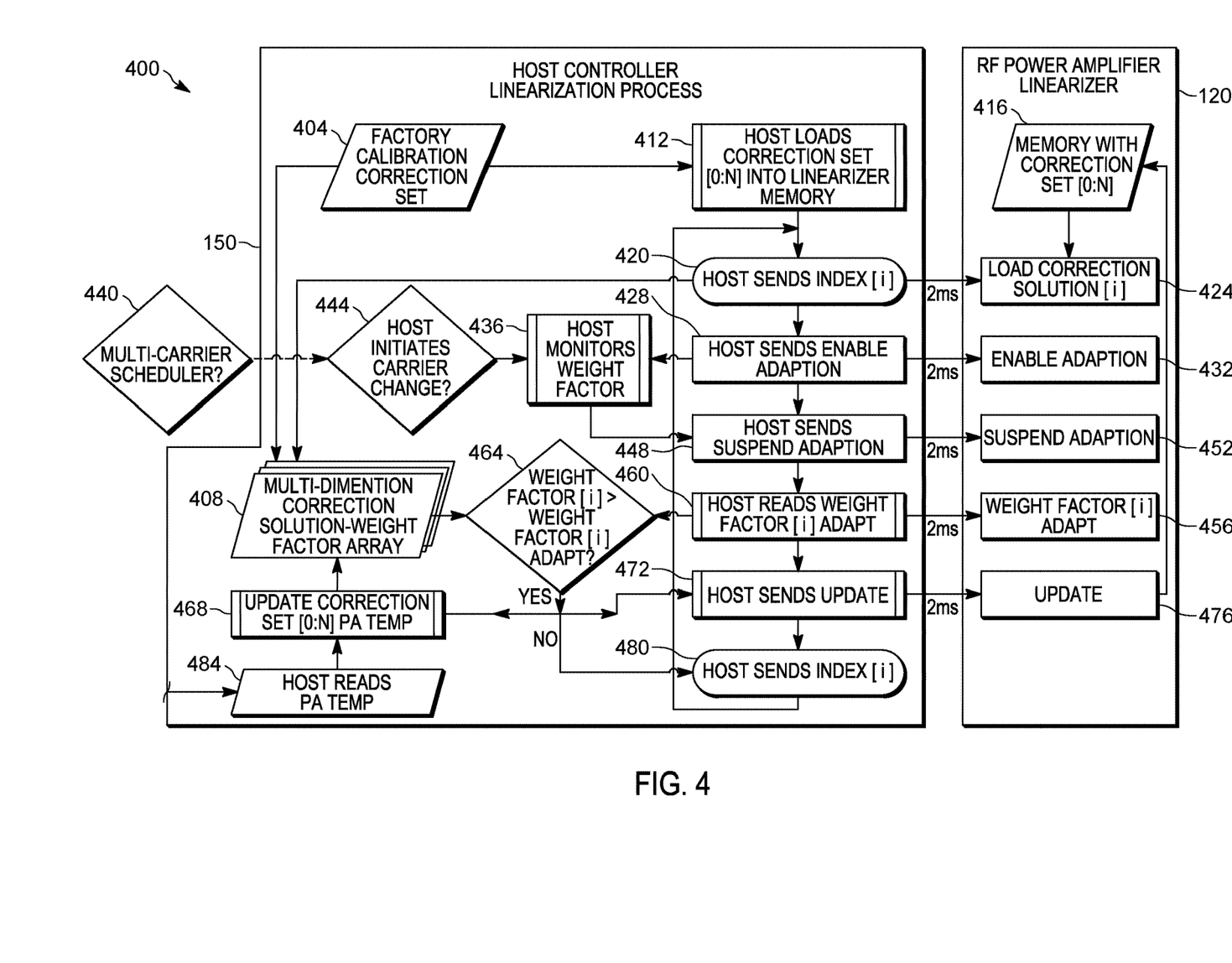
FIG. 4 is a process diagram of a method for dynamically linearizing multi-carrier power amplifiers in accordance with some embodiments.

FIG. 4 illustrates a process diagram of a method 400 for dynamically linearizing multi-carrier power amplifiers 105. The method 400 is similar to method 300 and the process diagram illustrates the states of the host controller 150 and the RF power amplifier linearizer 120 during linearization. In the example illustrated, the host controller 150 stores the factory calibration correction set including a plurality of correction solutions in the memory 165 (at block 404). Each one of the plurality of correction solutions is associated with one of a plurality of carrier configurations. Weight factors associated with each one of the plurality of the corrections solutions are also stored in the memory 165. The weight factors are calculated during manufacture of the host controller 150 or the multi-carrier power amplifier 105 and are associated with a first temperature value, for example, 25° C., a temperature range, and/or other power amplifier temperatures. The host controller 150 also stores a multi-dimension correction solution—weight factor array (at block 408). In one example, the host controller 150 stores a plurality of correction sets each corresponding to a particular temperature of the power amplifier 105. Each correction set includes a plurality of correction solutions and each one of the plurality of corrections solutions is associated with a weight factor.

The host controller 150 loads a correction set [0:N] into the RF power amplifier linearizer 120 memory (at block 412). In some instances, the RF power amplifier linearizer 120 has limited memory. As a consequence, the host controller 150 loads a limited number of correction solutions into the RF power amplifier linearizer 120 memory. The RF power amplifier linearizer 120 receives the correction set [0:N] into the RF power amplifier linearizer's memory (at block 416). As discussed above, the correction set may include up to twenty-eight correction solutions. The host controller 150 sends the correction solution index (INDEX [i]) to the RF power amplifier linearizer 120 (at block 420). In the example illustrated, the host controller 150 and the RF power amplifier linearizer 120 are designed to have a latency time of up to 2 milliseconds for a timeslot time of 100 milliseconds or less. The timeslot time corresponds to the frequency with which carrier configurations are changed. The latency time is the communication time and execution time of the host controller 150 and the RF power amplifier linearizer 120. The RF power amplifier linearizer 120 loads the correction solution corresponding to the correction solution index (at bock 424).

The host controller 150 instructs the RF power amplifier linearizer 120 to enable adaption (at block 428). The RF power amplifier linearizer 120 enables adaption (at block 432) in response to receiving the command from the host controller 150. The host controller 150 continues to monitor the weight factor (at block 436) for the duration of the timeslot. The host controller 150 executes the method 500 shown in FIG. 5 to monitor the weight factor.

As discussed above, the host controller 150 includes a multi-carrier scheduler 440 or communicates with a multi-carrier scheduler 440 that determines when a carrier change is initiated. The host controller 150 determines that a carrier change is initiated based on the multi-carrier scheduler 440 (at block 444). In response to initiating carrier change, the host controller 150 instructs the RF power amplifier linearizer 120 to suspend adaption (at block 448). The RF power amplifier linearizer 120 suspends adaption (at block 452) in response to receiving the command from the host controller 150.

The RF power amplifier linearizer 120 determines the linearizer weight factor for the adapted correction solution ([i]ADAPT) (at block 456). The host controller 150 reads the linearizer weight factor from the RF power amplifier linearizer 120 (at block 460). The host controller 150 also determines first weight factor corresponding to the first correction solution from the first mapping and the second mapping. The host controller 150 determines whether the linearizer weight factor ([i]ADAPT) is improved over the first weight factor corresponding to the first correction solution (at block 464). When the linearizer weight factor is improved over the first weight factor, the host controller 150 updates the multi-dimension correction solution—weight factor array to replace the first correction solution with the adapted correction solution (that is, the second correction solution) (at block 468). The host controller 150 may also instruct the RF power amplifier linearizer 120 to update the first correction solution in the corrections set loaded into the RF power amplifier linearizer 120 (at block 472). The RF power amplifier linearizer 120 updates the correction set [0:N] in response to receiving the instruction from the host controller 150 (at block 476) When the linearizer weight factor is not improved over the first weight factor or when the multi-dimension correction solution—weight factor array is updated, the host controller 150 proceeds to the next correction solution (at block 480).

In some embodiments, the host controller 150 may also determine a temperature of the power amplifier 105 (at block 484). The host controller 150 may also store the temperature of the power amplifier 105 recorded when the second correction solution is applied in the multi-dimension correction solution—weight factor array (at block 468).

FIG. 5 illustrates a process diagram of a method 500 for monitoring a weight factor during linearization. In the example illustrated, the host controller 150 turns on the adaption feature of the RF power amplifier linearizer 120 (at block 505). The RF power amplifier linearizer 120 continuously determines linearizer weight factor during linearization (at block 510). The host controller 150 reads the linearizer weight factor (for example, the second linearizer weight factor) from the RF power amplifier linearizer 120 at regular intervals (at block 515). The host controller 150 determines whether the linearizer weight factor read from the RF power amplifier linearizer 120 is optimal (at block 520). As discussed above, the linearizer weight factor is optimal when the linearizer weight factor is improved over a stored weight factor (that is, the weight factor associated with the first correction solution). When the linearizer weight factor is not optimal, the host controller 150 repeats block 515 and 520.

When the linearizer weight factor is optimal, the host controller 150 instructs the RF power amplifier linearizer 120 to suspend adaption (at block 525). The RF power amplifier linearizer 120 suspends adaptation in response to receiving the instruction (at block 530). The RF power amplifier linearizer 120 thereby suspends adaptation when an optimal correction solution is determined. In some embodiments, the host controller 150 may also store the second linearizer weight factor as the optimal weight factor for the current linearization process.

The RF power amplifier linearizer 120 continues to determine linearizer weight factor after adaption is suspended (at block 535). The host controller 150 reads the linearizer weight factor (for example, a third linearizer weight factor from the RF power amplifier linearizer 120 at regular intervals (at block 540). The host controller 150 determines whether the linearizer weight factor read from the RF power amplifier linearizer 120 is optimal (at block 545). For example, the host controller 150 compares the third linearization weight factor to the second linearization weight factor. When the linearizer weight factor is optimal, the host controller 150 repeats block 540 and 545.

When the linearizer weight factor is not optimal, the host controller 150 instructs the RF power amplifier linearizer 120 to enable adaption (at block 550). The RF power amplifier linearizer 120 enables adaptation in response to receiving the instruction from the host controller 150 (at block 555). Accordingly, the host controller 150 enables adaption when the weight factor falls below optimal levels and suspends adaption when the weight factor reaches optimal levels.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A host controller for a radio frequency (RF) power amplifier linearizer of a radio frequency (RF) transmitter, the host controller comprising:
   a memory storing a correction set including a plurality of correction solutions, each one of the plurality of correction solutions corresponding to one of a plurality of carrier configurations; and
   an electronic processor coupled to the memory and configured to
      load the correction set into the RF power amplifier linearizer,
      determine a first carrier configuration of the RF transmitter during a first timeslot of operation of the RF transmitter,
      send a first correction solution index to the RF power amplifier linearizer, the first correction solution index corresponding to a first correction solution of the plurality of correction solutions,
      determine that a carrier configuration change is initiated to operate the RF transmitter with a second carrier configuration during a second timeslot of operation of the RF transmitter, the second timeslot being subsequent to the first timeslot, and
      send a second correction solution index to the RF power amplifier linearizer, the second correction solution index corresponding to a second correction solution of the plurality of correction solutions.

2. The host controller of claim 1, wherein each one of the plurality of correction solutions is associated with a weight factor, and wherein the electronic processor is further configured to:
   enable adaption of the RF power amplifier linearizer, wherein the RF power amplifier linearizer adapts the first correction solution in response to enabling adaption to create a third correction solution;
   suspend adaption of the RF power amplifier linearizer in response to determining that the carrier configuration change is initiated;
   read a linearizer weight factor from the RF power amplifier linearizer associated with the third correction solution;
   compare the linearizer weight factor with a weight factor with the first correction solution; and
   replace the first correction solution with the third correction solution in response to determining that the linearizer weight factor is improved over the weight factor associated with the first correction solution.

3. The host controller of claim 2, wherein the electronic processor is further configured to:
   read a second linearizer weight factor from the RF power amplifier linearizer;
   compare the second linearizer weight factor to the weight factor associated with the first correction solution;
   suspend adaption in response to determining that the second linearizer weight factor is improved over the weight factor associated with the first correction solution;
   read a third linearizer weight factor from the RF power amplifier linearizer after suspending adaptation;
   compare the third linearizer weight factor to the second linearizer weight factor; and
   enable adaption in response to determining that the third linearizer weight factor is degraded over the second linearizer weight factor.

4. The host controller of claim 2, wherein the correction set is associated with a first temperature value and wherein the electronic processor is further configured to:
   read a power amplifier temperature value associated with the third correction solution; and
   generate a second correction set associated with the power amplifier temperature value including the plurality of correction solutions from the correction set, wherein the first correction solution is replaced with the third correction solution in the second correction set.

5. The host controller of claim 4, wherein the electronic processor is further configured to:
   read a second power amplifier temperature value; and
   load a third correction set associated with the second power amplifier temperature value into the RF power amplifier linearizer.

6. The host controller of claim 1, wherein the first carrier configuration is determined based on at least one selected from a group consisting of a number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, and carrier bandwidths of each of the RF carriers.

7. A method for dynamically linearizing multi-carrier power amplifiers, the multi-carrier power amplifiers provided in a radio frequency (RF) transmitter, the method comprising:
   storing, using a memory of a host controller, a correction set including a plurality of correction solutions, each one of the plurality of correction solutions corresponding to one of a plurality of carrier configurations;
   loading, using an electronic processor of the host controller, the correction set into the RF power amplifier linearizer;
   determining, using the electronic processor, a first carrier configuration of the RF transmitter during a first timeslot of operation of the RF transmitter;
   sending, using the electronic processor, a first correction solution index to the RF power amplifier linearizer, the first correction solution index corresponding to a first correction solution of the plurality of correction solutions;
   determining, using the electronic processor, that a carrier configuration change is initiated to operate the RF transmitter with a second carrier configuration during a second timeslot of operation of the RF transmitter, the second timeslot being subsequent to the first timeslot; and sending, using the electronic processor, a second correction solution index to the RF power amplifier linearizer, the second correction solution index corresponding to a second correction solution of the plurality of correction solutions.

8. The method of claim 7, wherein each one of the plurality of correction solutions is associated with a weight factor, the method further comprising:
enabling, using the electronic processor, adaption of the RF power amplifier linearizer, wherein the RF power amplifier linearizer adapts the first correction solution in response to enabling adaption to create a third correction solution;
suspending, using the electronic processor, adaption of the RF power amplifier linearizer in response to determining that the carrier configuration change is initiated;
reading, using the electronic processor, a linearizer weight factor from the RF power amplifier linearizer associated with the third correction solution;
comparing, using the electronic processor, the linearizer weight factor with a weight factor with the first correction solution, and
replacing, using the electronic processor, the first correction solution with the third correction solution in response to determining that the linearizer weight factor is improved over the weight factor associated with the first correction solution.

9. The method of claim 8, further comprising:
reading, using the electronic processor, a second linearizer weight factor from the RF power amplifier linearizer;
comparing, using the electronic processor, the second linearizer weight factor to the weight factor associated with the first correction solution;
suspending, using the electronic processor, adaption in response to determining that the second linearizer weight factor is improved over the weight factor associated with the first correction solution;
reading, using the electronic processor, a third linearizer weight factor from the RF power amplifier linearizer after suspending adaptation,
comparing, using the electronic processor, the third linearizer weight factor to the second linearizer weight factor, and
enabling, using the electronic processor, adaption in response to determining that the third linearizer weight factor is degraded over the second linearizer weight factor.

10. The method of claim 8, wherein the correction set is associated with a first temperature value, the method further comprising:
reading a power amplifier temperature value associated with the third correction solution;
generating, using the electronic processor, a second correction set associated with the power amplifier temperature value including the plurality of correction solutions from the correction set, wherein the first correction solution is replaced with the third correction solution in the second correction set.

11. The method of claim 10, further comprising:
reading a second power amplifier temperature value; and
loading, using the electronic processor a third correction set associated with the second power amplifier temperature value into the RF power amplifier linearizer.

12. The method of claim 7, wherein the first carrier configuration is determined based on at least one selected from a group consisting of a number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, and carrier bandwidths of each of the RF carriers.

13. A host controller for a radio frequency (RF) power amplifier linearizer of a radio frequency (RF) transmitter, the host controller comprising:
a memory a correction set including a plurality of correction solutions, each one of the plurality of correction solutions corresponding to one of a plurality of carrier configurations and associated with a weight factor; and
an electronic processor coupled to the memory and configured to
load the correction set into the RF power amplifier linearizer,
determine a first carrier configuration of the RF transmitter during a first timeslot of operation of the RF transmitter,
send a correction solution index to the RF power amplifier linearizer, the correction solution index corresponding to a first correction solution of the plurality of correction solutions,
enable adaption of the RF power amplifier linearizer, wherein the RF power amplifier linearizer adapts the first correction solution in response to enabling adaption to create a second correction solution,
determine that a carrier configuration change is initiated to operate the RF transmitter with a second carrier configuration during a second timeslot of operation of the RF transmitter, the second timeslot being subsequent to the first timeslot;
suspend adaption of the RF power amplifier linearizer in response to determining that the carrier configuration change is initiated;
read a linearizer weight factor from the RF power amplifier linearizer associated with the second correction solution;
compare the linearizer weight factor with a weight factor associated with the first correction solution; and
replace the first correction solution with the second correction solution in response to determining that the linearizer weight factor is improved over the weight factor associated with the first correction solution.

14. The host controller of claim 13, wherein the electronic processor is further configured to:
read a second linearizer weight factor from the RF power amplifier linearizer;
compare the second linearizer weight factor to the weight factor associated with the first correction solution;
suspend adaption in response to determining that the second linearizer weight factor is improved over the weight factor associated with the first correction solution;
read a third linearizer weight factor from the RF power amplifier linearizer after suspending adaptation;
compare the third linearizer weight factor to the second linearizer weight factor; and
enable adaption in response to determining that the third linearizer weight factor is degraded over the second linearizer weight factor.

15. The host controller of claim 13, wherein the correction set is associated with a first temperature value and wherein the electronic processor is further configured to:
- read a power amplifier temperature value associated with the second correction solution; and
- generate a second correction set associated with the power amplifier temperature value including the plurality of correction solutions from the correction set, wherein the first correction solution is replaced with the second correction solution in the second correction set.

16. The host controller of claim 15, wherein the electronic processor is further configured to:
- read a second power amplifier temperature value; and
- load a third correction set associated with the second power amplifier temperature value into the RF power amplifier linearizer.

17. The host controller of claim 13, wherein the first carrier configuration is determined based on at least one selected from a group consisting of a number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, and carrier bandwidths of each of the RF carriers.

* * * * *